(12) United States Patent
Meijer et al.

(10) Patent No.: US 7,514,186 B2
(45) Date of Patent: Apr. 7, 2009

(54) SYSTEM FOR ELECTRICALLY CONNECTING A MASK TO EARTH, A MASK

(75) Inventors: Hendricus Johannes Maria Meijer, Veldhoven (NL); Uwe Mickan, Veldhoven (NL); Marco Le Kluse, Maassluis (NL)

(73) Assignee: ASML Netherlands B.V., Veldhoven (NL)

( * ) Notice: Subject to any disclaimer, the term of this patent is extended or adjusted under 35 U.S.C. 154(b) by 615 days.

(21) Appl. No.: 11/167,560

(22) Filed: Jun. 28, 2005

(65) Prior Publication Data

US 2006/0292457 A1 Dec. 28, 2006

(51) Int. Cl.
*G03F 1/00* (2006.01)
(52) U.S. Cl. .......................................... 430/5
(58) Field of Classification Search ...................... 430/5; 378/35
See application file for complete search history.

(56) References Cited

U.S. PATENT DOCUMENTS

| 6,178,221 | B1 | 1/2001 | Levinson et al. | 378/35 |
| 6,180,291 | B1 | 1/2001 | Bessy et al. | 430/5 |
| 6,841,309 | B1 | 1/2005 | Alpay et al. | 430/5 |
| 6,984,475 | B1 | 1/2006 | Levinson et al. | 430/5 |

FOREIGN PATENT DOCUMENTS

| JP | 9-205050 | 8/1997 |
| JP | 11-214242 | 8/1999 |

*Primary Examiner*—Stephen Rosasco
(74) *Attorney, Agent, or Firm*—Sterne, Kessler, Goldstein & Fox P.L.L.C.

(57) ABSTRACT

A reticle includes an area provided with a conductive metal-based compound coating for electrically grounding the reticle. The reticle is suitable for use with a lithography apparatus whereby the reticle pattern is imaged using extreme ultra violet radiation. One or more conducting pins, held at zero potential, may be pressed against the conductive coating for electrically grounding the reticle either during patterning the reticle by electron beam writing or during use in the lithographic apparatus. The areas coated with the metal-based compounds are wear resistant which reduces the occurrence of particles due to damage caused by mechanical contact between the conducting pins and the conductive coating.

20 Claims, 5 Drawing Sheets

SYSTEM FOR ELECTRICALLY CONNECTING A MASK TO EARTH, A MASK

BACKGROUND OF THE INVENTION

1. Field

The present invention relates to a patterning device for a lithographic apparatus.

2. Background

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate.

In an EUV lithographic apparatus extreme ultra-violet (EUV) radiation is used for imaging. This radiation has a wavelength in the range of 5-20 nm. The use of refractive optical elements in EUV lithography machines is not feasible due to absorption in bulk material of EUV radiation. Consequently, for EUV lithography reflective optical systems are used for imaging, and reflective reticles are used for patterning. A reflective reticle includes a pattern of reflective and absorbing (or at least less reflective) areas on one surface (the "front surface") of the reticle. The pattern is generated using an electron beam ("e-beam") writing tool. To avoid electron-beam writing-errors due to electrostatic fields near the front surface of the EUV reticle during patterning the EUV reticle, the reticle front surface is electrically grounded during e-beam writing. To that purpose a conductive coating is provided to an area at the front surface. An electric conductor, connected to earth, is brought in contact with the frontside conductive coating, to establish the required electrical grounding of the reticle.

Not only during patterning the reflective reticle, but also when in use in an EUV lithography apparatus the reflective reticle is electrically grounded. Impact with EUV photons may cause electrons to be freed from the reticle (for example, from the reticle substrate or its surface and/or from an absorber layer or a reflective multi-layer) and as a result a subsequent electrostatic charging of the substrate takes place. Electrical grounding is applied to avoid negative effects due to an electric field caused by electrostatic charging of the reticle. In an EUV machine a reticle support is capable of clamping the reflective reticle at the backside of the reticle (i.e. the side facing the side provided with the pattern). The reticle may be held in place by means of electrostatic clamping of the reticle to a chuck which is part of the reticle support. During electrostatic clamping a conductive coating at the backside of the reticle is held at electrical ground, and electrostatic clamping forces are generated by applying a voltage between this conductive coating and a conductive layer inside the chuck. For example, with the coating of the reticle at electric ground level, the conductive layer in the chuck may be held at 1000 V.

To obtain electrical grounding of the reticle, an electric conductor connected to earth may be brought into contact with the conductive coating at the front surface of the reticle and/or a conductive coating used for electrostatic clamping of the reticle. The conductor may for example be embodied as a spring-loaded metal pin. A finite force is needed to bring and keep the conductor or pin in contact with the conductive coating such as to obtain a sufficiently low contact resistance, and consequently the conductor may slightly damage the coating and may generate particles, which should be avoided in both the electron beam writing tool and in the EUV lithographic apparatus.

SUMMARY

It is an aspect of the invention to alleviate the problem of particle generation.

According to an aspect of the invention, there is provided a system for electrically connecting a mask for EUV lithography to earth including a conductor connected to earth and arranged to make electric contact with a conductive coating covering at least a part of said mask, whereby the conductive coating includes a layer consisting of a metal-based compound.

According to a further aspect of the invention there is provided a mask for patterning an EUV beam of radiation whereby at least one of a front surface for carrying a pattern, a back surface facing said front surface, and a side surface, is provided with a conductive coating for electrically grounding the mask, and whereby the conductive coating includes a layer consisting of a metal-based compound.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
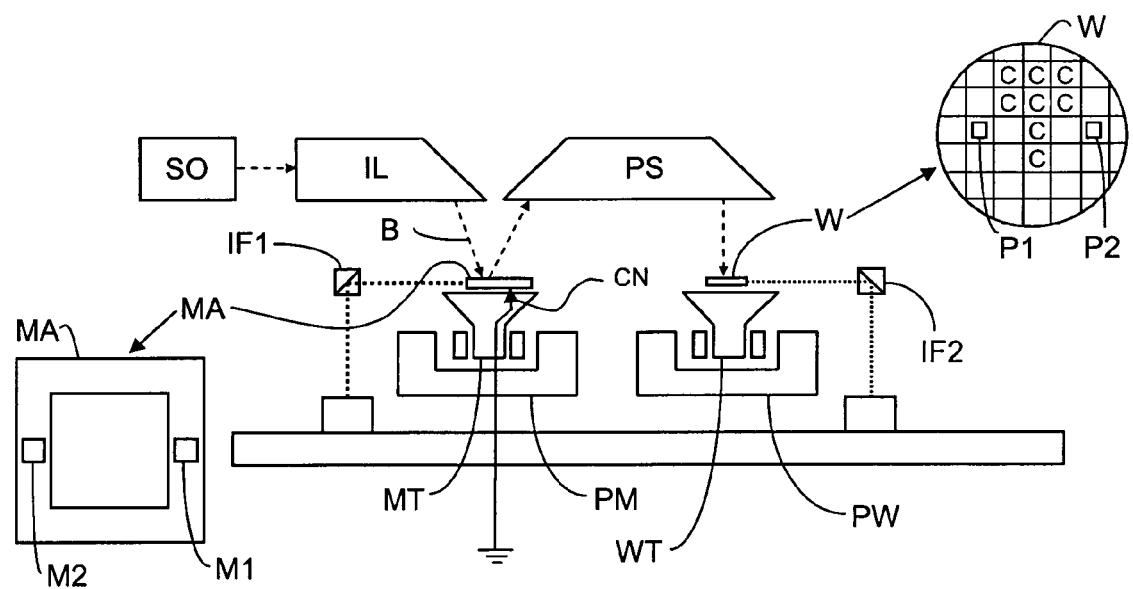
FIG. 1 depicts a system for electrically grounding an EUV reticle held by a reticle chuck of a lithographic apparatus.

FIG. 1 schematically depicts an EUV lithographic apparatus comprising a system for electrostatic clamping a mask MA for patterning an EUV beam of radiation to a chuck MT according to an embodiment of the invention. The apparatus comprises:

an illumination system (illuminator) IL configured to condition an EUV radiation beam B;

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system PS configured to project a pattern imparted to the radiation beam B by patterning device MA onto a target portion C (e.g. comprising one or more dies) of the substrate W.

The support structure MT supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure may be a frame, a table or a chuck, for example, which may be fixed or movable as required. The support structure may ensure that the patterning device is at a desired position, for example with respect to the projection system. Any use of the terms "reticle" or "mask" herein may be considered synonymous with the more general term "patterning device". The term "patterning device" used herein should be broadly interpreted as referring to any device that can be used to impart a radiation beam with a pattern in its cross-section such as to create a pattern in a target portion of the substrate. Generally, the pattern imparted to the radiation beam will correspond to a particular functional layer in a device being created in the target portion, such as an integrated circuit. As here depicted, the apparatus is of a reflective type employing a reflective mask.

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from an EUV radiation source SO. The source SO and the illuminator IL may be referred to as a radiation system.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The support structure MT uses electrostatic clamping techniques to hold the patterning device. A conductor CN connected to electrical earth is contacting a conductive metal-based nitride thin film coating (not shown in FIG. 1) provided at the back side surface of the mask MA (facing the chuck MT).

Figure 2:
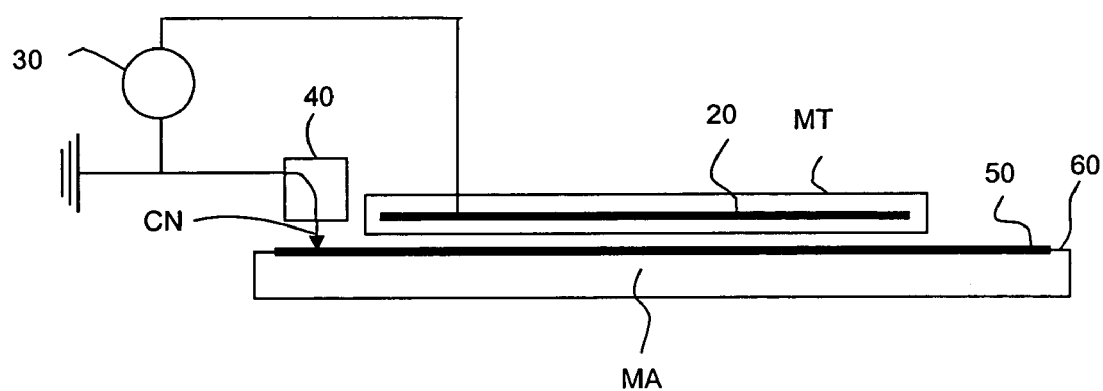
FIG. 2 illustrates a side view of an arrangement for electrostatic EUV reticle clamping including a conductive coating for electrical grounding.

FIG. 2 schematically depicts the system for electrically connecting the mask MA to earth and the system for electrostatic clamping of the EUV reticle MA to a chuck MT in more detail. A chuck MT includes a conductive layer 20 which is held at a voltage different from zero by a voltage supply 30. The electric ground line of the voltage supply 30 is connected to the conductor CN which is capable of contacting the conductive metal-based compound coating 50 provided on the backside 60 of the EUV reticle MA. The conductor CN may be part of a device 40 arranged to exert a force on the conductor CN pressing the conductor CN against the coating 50. The voltage applied may for example be 1000 V.

The system for connecting to earth the mask MA, as illustrated in FIG. 2, can be used in an electron beam mask writing arrangement to avoid electrostatic charging and to avoid electron path errors due to such a charging, and is not limited to use in a lithographic apparatus. In an electron beam writing arrangement, an electron beam is used for patterning a material layer sensitive to electron beam radiation and provided to a surface of the mask substrate.

A front side conductive coating, not shown in FIG. 2, may (in view of possible limited clearances at the front side during e-beam patterning or during usage in a lithographic process) be electrically connected to the conductive coating 50 at the backside of the reticle via a conductive path along the side of the reticle. The required electrical grounding of the reticle at the front side, either during a lithographic process or during e-beam patterning, is obtained by bringing the electric conductor CN, connected to earth, in contact with the backside conductive coating 50.

Compared to metal coatings, metal-based compound conductive coatings such as a metal-based nitride layer exhibit a high hardness and a high chemical stability in combination with an electrical conductivity sufficient for the purpose of connection to zero potential. This type of layer is wear resistant and therefore less prone to particle generation and coating damage due to the pressure exerted by the contact device CN. Consequently the problem of generation of particles during an EUV lithographic process or during an e-beam mask writing process is alleviated.

A mask according to the present invention comprises a conductive, metal-compound coating 50 which is embodied as a metal-based nitride layer which combines a high hardness and a high chemical stability with an electrical conductivity sufficiently high for the purpose of electrically connecting to earth. The conductive coating may have a conductivity of 200 $(Ohm*cm)^{-1}$ or higher. Any conductivity in a range 100 $(Ohm*cm)^{-1}$ or higher constitutes a conductivity suitable for enabling electrical contact and for charge transfer to electrical earth-potential with masks according to the present invention.

Metal-based nitride coatings may be grown on a mask substrate in a low pressure plasma environment by vapor phase deposition techniques, including for example sputtering and/or reactive sputtering processes.

In embodiments of the invention the mask MA comprises a conductive metal-compound coating 50 for grounding the mask MA which includes, for example, a layer selected from the group of layers consisting of titanium nitride, titanium carbide, titanium carbonitride, tantalum nitride, tantalum carbide, tantalum carbonitride, chrome nitride and aluminum nitride layers. Any of these layers may be grown by above mentioned deposition techniques.

During e-beam writing as well as during lithographic projection, there is a finite Ohmic resistance associated with the contact between the conductor and the conductive coating. The magnitude of this contact-resistance depends on the force with which the conductor presses into the conductive coating, and on other possible sources of resistance such as, for example, the presence of any non-conducting or substantially non-conducting thin layers or atomic layers or contaminants present on or in the conductive coating. For example, where the conductive coating is a conventional metal coating, a metal-oxide contamination or even a metal-oxide layer may be present due to exposure (during handling) to any ambient oxygen present in the environment. Such an additional oxide-layer raises the contact resistance beyond tolerance. This can be alleviated by increasing the force with which the conducting contact is pushed against the conductive coating, which may, however, cause shape deformations of the mask MA beyond tolerance.

Besides above mentioned high hardness, wear resistance, and high chemical stability in combination with an electrical conductivity sufficient for the purpose of electrical connecting to earth, metal-based compound layers such as metal-based nitride coatings are inert in relation to oxidants and or contaminants. This alleviates a problem associated with the use of a conventional metal coating, whereby in the presence of a corresponding metal-oxide layer (due to environmental oxygen) an increase of force with which the metal contact CN is pushed against the metal coating would be needed to lower the contact resistance, which may lead to a deformation of shape of the reticle beyond tolerance.

In an embodiment, the mask MA comprises a conductive metal-compound coating 50 which is embodied as a multi-layer coating. The multilayer coating may for example include a plurality of metal-based nitride and/or carbide and/or carbonitride layers.

With any of above mentioned embodiments one or more contacts CN may be used simultaneously for grounding the mask MA. Because of the inertness in relation to oxidants and or contaminants of the metal-based compound layer 50, the force exerted by the contacts CN on the reticle MA can be kept sufficiently low to avoid deformation of the reticle beyond its flatness specification. And in view of the low contact force required in conjunction with a reticle MA according to the present invention, a plurality of alternative force exerting devices 40 can be arranged and used. For example, the force generated by the device 40 may be a magnetic force, an inductive force, a capacitive force, an electric force and a force derived from gravity.

Figure 3:
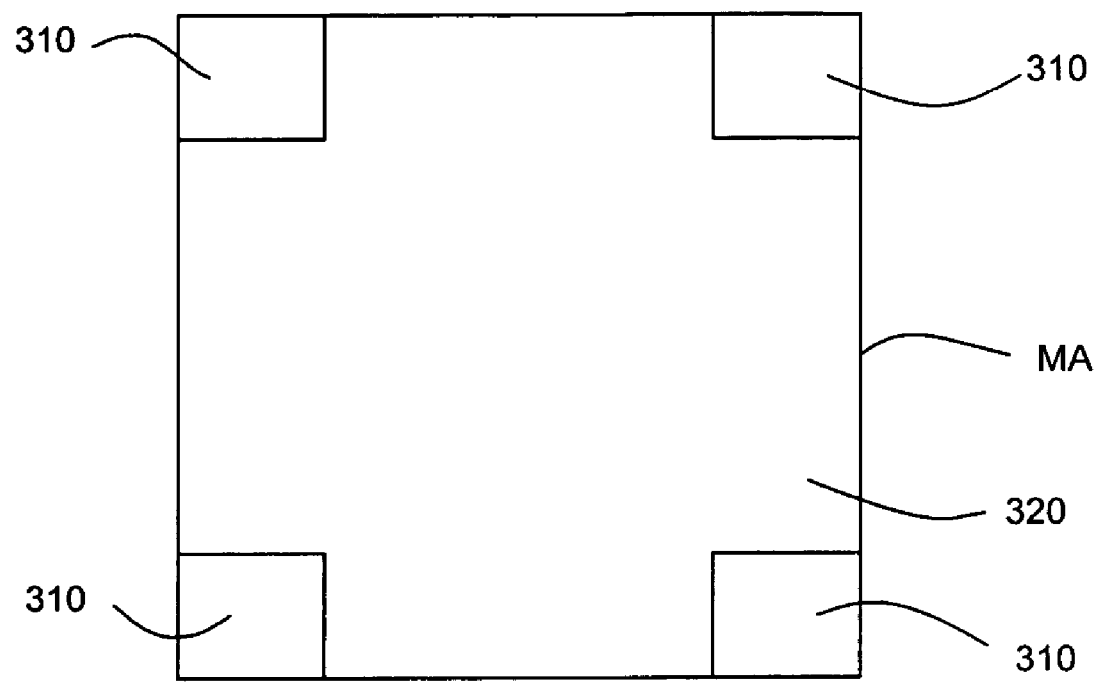
FIG. 3 illustrates a top view on a backside of an EUV reticle including a conductive coating for electrical grounding and clear areas for handling.

According to an embodiment of the invention illustrated in FIG. 3, the back surface of the reticle MA is partitioned into a plurality of coating free areas 310 for handling of the reticle MA (in, for example, a transport box) and an area 320 which includes a metal-compound conductive coating (not shown) for electrical grounding using one or more contacts CN.

Figure 4:
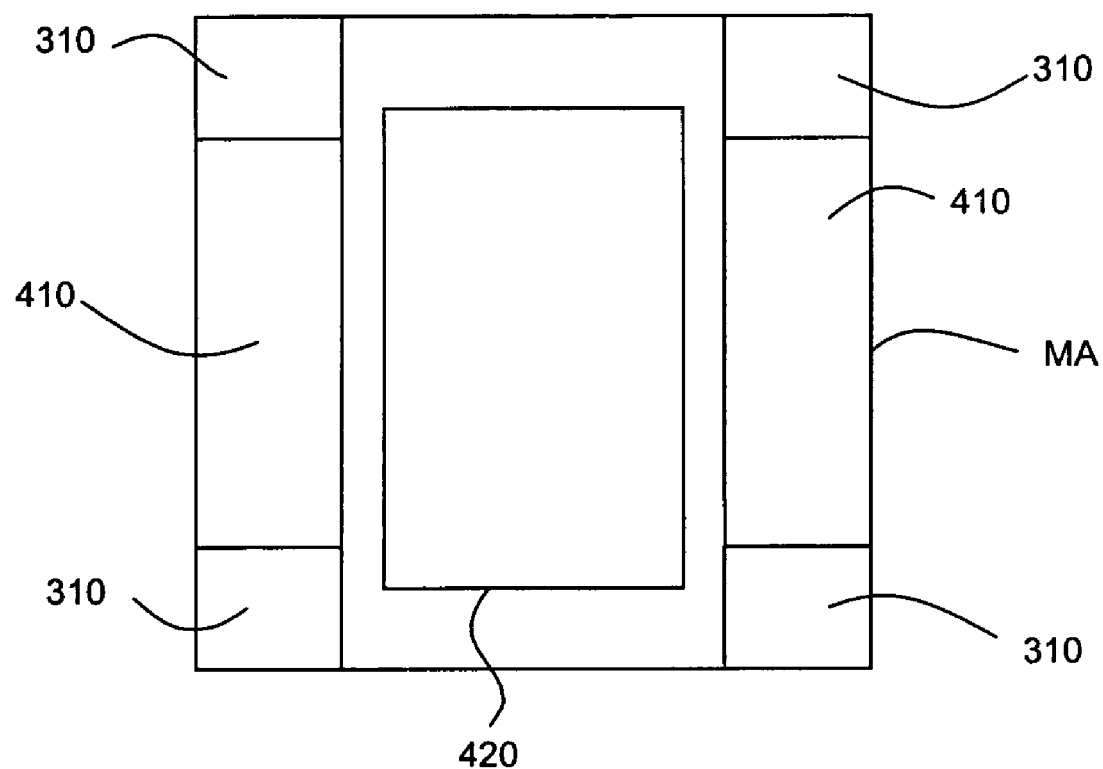
FIG. 4 illustrates a top view on a backside of an EUV reticle including a conductive coating for electrical grounding and for electric clamping.

In FIG. 4 a further embodiment of a mask MA according to the invention is illustrated, whereby the backside of the reticle MA is partitioned into areas 410 which include a metal-compound conductive coating (not shown) for electrical grounding, areas 310 which are coating free areas for handling of the reticle MA, and an area 420 which is electrically isolated from the areas 410 and which is provided with a conductive coating (not shown) for electrostatic clamping. The latter coating (for electrostatic clamping) may be a conductive metal-compound coating or a metal coating. During e-beam writing of the mask pattern, the conductors in the areas 410 and 420 may be kept at a preselected electric potential-difference.

Figure 5:
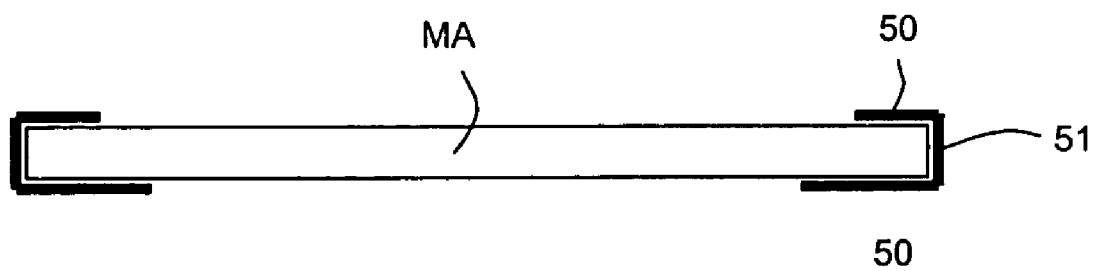
FIG. 5 shows a side view of a reticle with metal-compound conductive coatings on both front and back surfaces, electrically connected to each other.

In an embodiment of a mask according to the invention, front and back side metal-based compound coatings are electrically connected to each other. FIG. 5 illustrates a side view of a mask MA whereby conductive metal-compound coatings on each side of the reticle are electrically connected by a conductive coating 51 on a side surface of the reticle. Grounding the front side of the reticle can be used to reduce electron beam writing errors during patterning the reticle MA. The coating 51 can include or consist of a conductive metal-compound coating as described in any of the above embodiments.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, and where the context allows, is not limited to optical lithography.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A system for electrically connecting a mask for EUV lithography to earth including a conductor connected to earth and arranged to make electric contact with
   a first conductive coating covering a first end surface at a first end of the mask, at least a first portion of a back surface of the mask, and a first portion of a front surface of the mask, and
   a second conductive coating covering a second end surface at a second end of the mask, at least a second portion of the back surface of the mask, and a second portion of the front surface of the mask,
   whereby the first conductive coating on the first portion of the front surface of the mask and the second conductive coating on the second portion of the front surface of the mask are unconnected on the front surface of the mask, and
   whereby the first and second conductive coatings include a layer consisting of a metal-based compound.

2. A system according to claim 1, whereby the metal-based compound is a metal-based nitride.

3. A system according to claim 2, whereby the metal-based nitride is one of the group of nitrides consisting of titanium nitride, titanium carbonitride, tantalum nitride, tantalum carbonitride, chrome nitride and aluminum nitride.

4. A system according to claim 1, whereby the metal-based compound is a metal-based carbide.

5. A system according to claim 4, whereby the metal-based carbide is one of the group of metal-based carbides consisting of titanium carbide and tantalum carbide.

6. A system according to claim 1, whereby the metal-based compound is a metal-based carbonitride.

7. A system according to claim 1, whereby the conductive coatings each include a plurality of layers each consisting of a metal-based compound.

8. A system according to claim 1, whereby a conductivity of the metal-based compound is higher than $100\,(\text{Ohm}*\text{cm})^{-1}$.

9. A system according to claim 1, whereby the back surface includes areas free of the conductive coatings that are designated for handling of the mask.

10. A system according to claim 1, whereby the back surface includes a conductive area electrically isolated from the conductive coatings that is designated for electrostatic clamping of the mask to a support structure.

11. A mask for patterning an EUV beam of radiation comprising:
    a front surface for carrying a pattern;
    a back surface facing the front surface;
    a first side surface connecting a first end of the front surface to a first end of the back surface;
    a second side surface connecting a second end of the front surface to a second end of the back surface; and
    a conductive coating for electrically grounding the mask, the conductive coating including
        a first coating portion covering the first side surface, a first portion of the front surface adjacent the first side surface, and at least a first portion of the back surface adjacent the first side surface, and
        a second coating portion covering the second side surface, a second portion of the front surface adjacent the second side surface, and at least a second portion of the back surface adjacent the second side surface,
    whereby the first coating portion and the second coating portion are unconnected on the front surface of the mask, and
    whereby the conductive coating includes a layer consisting of a metal-based compound.

12. A mask according to claim 11, whereby the metal-based compound is a metal-based nitride.

13. A mask according to claim 12, whereby the metal-based nitride is one of the group of nitrides consisting of titanium nitride, titanium carbonitride, tantalum nitride, tantalium carbonitride, chrome nitride and aluminum nitride.

14. A mask according to claim 11, whereby the metal-based compound is a metal-based carbide.

15. A mask according to claim 14, whereby the metal-based carbide is one of the group of metal-based carbides consisting of titanium carbide and tantalum carbide.

16. A mask according to claim 11, whereby the metal-based compound is a metal-based carbonitride.

17. A mask according to claim 11, whereby the conductive coating includes a plurality of layers each consisting of a metal-based compound.

18. A mask according to claim 11, whereby a conductivity of the metal-based compound is higher than $100\,(\text{Ohm}*\text{cm})^{-1}$.

19. A mask according to claim 11, whereby the back surface is partitioned into areas which include a metal-compound conductive coating and separate areas which are designated for handling of the mask.

20. A mask according to claim 11, whereby the back surface includes a conductive area electrically isolated from the conductive coatings that is designated for electrostatic clamping of the mask to a support structure.

* * * * *